United States Patent [19]
Phillips et al.

[11] Patent Number: 5,936,451
[45] Date of Patent: *Aug. 10, 1999

[54] DELAY CIRCUIT AND METHOD

[75] Inventors: William A. Phillips, Royal Oak, Mich.; Mario Paparo, S. Giovanni Della Punta; Piero Capocelli, Milan, both of Italy

[73] Assignee: STMicroeletronics, Inc., Carrollton, Tex.

[ * ] Notice: This patent issued on a continued prosecution application filed under 37 CFR 1.53(d), and is subject to the twenty year patent term provisions of 35 U.S.C. 154(a)(2).

[21] Appl. No.: 08/897,187

[22] Filed: Jul. 21, 1997

Related U.S. Application Data

[63] Continuation of application No. 08/595,512, Feb. 1, 1996, abandoned, which is a continuation of application No. 08/411,556, Mar. 28, 1995, abandoned, which is a continuation-in-part of application No. 08/365,685, Dec. 29, 1994.

[51] Int. Cl.$^6$ ........................................ H03K 5/13
[52] U.S. Cl. ........................... 327/285; 327/288; 327/263; 327/278
[58] Field of Search ................................ 327/285, 276, 327/277, 278, 284, 281, 288, 263, 264; 365/194; 331/57

[56] References Cited

U.S. PATENT DOCUMENTS

| | | | |
|---|---|---|---|
| 4,740,743 | 4/1988 | Reisinger et al. | 323/316 |
| 4,806,804 | 2/1989 | O'Leary | 327/277 |
| 4,812,687 | 3/1989 | Larson et al. | 307/601 |
| 4,875,020 | 10/1989 | Daniele et al. | 330/307 |
| 5,006,738 | 4/1991 | Usuki et al. | 327/285 |
| 5,057,722 | 10/1991 | Kobatake | 327/288 |
| 5,068,628 | 11/1991 | Groshal | 327/7 |
| 5,081,380 | 1/1992 | Chen | 327/281 |
| 5,175,452 | 12/1992 | Lupi et al. | 327/277 |
| 5,227,679 | 7/1993 | Woo | 327/269 |
| 5,231,319 | 7/1993 | Crafts et al. | 327/277 |
| 5,300,837 | 4/1994 | Fischer | 327/281 |
| 5,317,219 | 5/1994 | Lupi et al. | 307/603 |
| 5,382,840 | 1/1995 | Massoner | 327/206 |

FOREIGN PATENT DOCUMENTS

| | | | |
|---|---|---|---|
| 0405319A1 | 1/1991 | European Pat. Off. | H03H 11/26 |
| 0535359 | 8/1992 | European Pat. Off. | 327/288 |
| 1161913 | 6/1989 | Japan | 327/211 |
| 4-144309 | 5/1992 | Japan | 327/281 |

*Primary Examiner*—Toan Tran
*Assistant Examiner*—Eunja Shin
*Attorney, Agent, or Firm*—Theodore E. Galanthay; Lisa K. Jorgenson; Renee M. Larson

[57] ABSTRACT

A reduced area delay circuit and method are disclosed. The delay circuit uses a constant current source and a constant current drain to charge and discharge a capacitor and thus control the delay time of the delay circuit. The constant current source and drain can be implemented using current mirrors formed by configuring MOSFET transistors in a common source configuration. The delay circuit method includes the steps of receiving an input signal, delaying the input signal by using a constant current source or drain in combination with a capacitor, and then buffering the voltage on the capacitor using two inverters. A programmable delay circuit is also disclosed by adding additional pairs of current mirrors to the delay circuit and selectively enabling the pairs to adjust the delay time.

15 Claims, 2 Drawing Sheets

DELAY CIRCUIT AND METHOD

CROSS REFERENCE TO A RELATED APPLICATION

This is a Continuation of application Ser. No. 08/595,512, filed on Feb. 1, 1996, which has been abandoned, which is a continuation of Ser. No. 08/411,556, filed on Mar. 28, 1995, which has been abandoned, which is a Continuation In Part of Ser. No. 08/365,685, filed Dec. 29, 1994, and entitled A DELAY CIRCUIT AND METHOD, which is a pending application.

BACKGROUND OF THE INVENTION

1. Field of the Invention

This invention relates to electronic circuits used to delay signals and more specifically to circuits used to delay the turn-on of a power transistor in a bridge configuration.

2. Description of the Relevant Art

The problem addressed by this invention is encountered when power transistors are used to drive a prior art bridge configuration such as in FIG. 1. The bridge configuration 2 can be used to power motors, drive solenoids, and the like. The bridge configuration 2 is characterized by the high side driver transistor 4 being connected in series to a low side driver transistor 6 across the voltage of a power supply. In this configuration, node 12 is driven to the power supply voltage when the high side transistor 4 is on and transistor 6 is off. Conversely, node 12 is sunk to ground when high side transistor 4 is off and lowside transistor 6 is on. If the high side and low side transistors are both turned off, then node 12 is at a high impedance state. However, if both high side 4 and low side 6 transistors are turned on, then the transistors are shorting the power supply voltage to ground which would draw an excessive amount of current and would damage one or both of the transistors. The bridge configuration is never used with both high side and low side drivers on at the same time because of the potentially disastrous results. Consequently, it is common to use a delay circuit as part of the control logic in the control block 9 to prevent the turn-on of one driver transistor until the other driver is turned off. In principle, one of the drivers is turned off while the other driver is turned on, but only after the delay circuit has delayed the turn-on by an amount of time which will guarantee that the other driver is in fact turned off.

FIG. 2 illustrates a prior art delay circuit 20 used in the control block 9 of FIG. 1 for delaying the turn-on of the driver transistors 4 or 6. In delay circuit 20, p-channel transistor 22 and n-channel transistor 24 form a first inverter. Similarly, p-channel transistor 30 and n-channel transistor 32 form a second inverter. The gates of transistors 22 and 24 form the inputs of the first inverter and the drain of transistor 30 and the drain of transistor 32 form the output of the second inverter. In operation, as the input signal goes from a low voltage to a high voltage, transistor 22 turns off and transistor 24 turns on. As a result, the voltage at node 23 drops from near Vdd to near ground. Consequently, the charge on capacitor 28 is drained through resistor 26 and transistor 24. The rate of discharge is determined by the size of resistor 26 and capacitor 28 as is known in the art. When the voltage on node 31 reaches approximately 2.5 volts, transistor 32 turns off and transistor 30 turns on which raises the voltage at node 33. The time delay can be approximated by the equation:

$$T_{delay} = (R26)(C28) \ln(1 - Vdd/V_{threshold})$$

Therefore, the rising signal on the input of the delay circuit 20 is passed on to the output of the delay signal 33, but only after the delay created by the time constant of resistor 26 and capacitor 28. However, prior art delay circuit 20 is limited since it often requires relatively large capacitors and/or resistors to obtain long delays. The requirement of a large capacitor or resistor is undesirable since a large capacitor or resistor typically requires large amounts of silicon on an integrated circuit or requires an external connection for an external capacitor. Since the cost of a integrated circuit is directly proportional to the die size, it is desirable to reduce the size of a circuit whenever possible.

SUMMARY OF THE INVENTION

Therefore, it is an object of the invention to provide relatively long delays without requiring a large capacitor or a large resistor.

It is further an object of this invention to provide a delay circuit which provides relatively long delays and without requiring large area on an integrated circuit.

It is further an object of this invention to provide a delay circuit which reduces the cost of a delay circuit by reducing the die area necessary to implement the circuit.

These and other objects, features, and advantages of the invention will be apparent to those skilled in the art from the following detailed description of the invention, when read with the drawings and appended claims.

DETAILED DESCRIPTION OF THE PREFERRED EMBODIMENT

Figure 3:
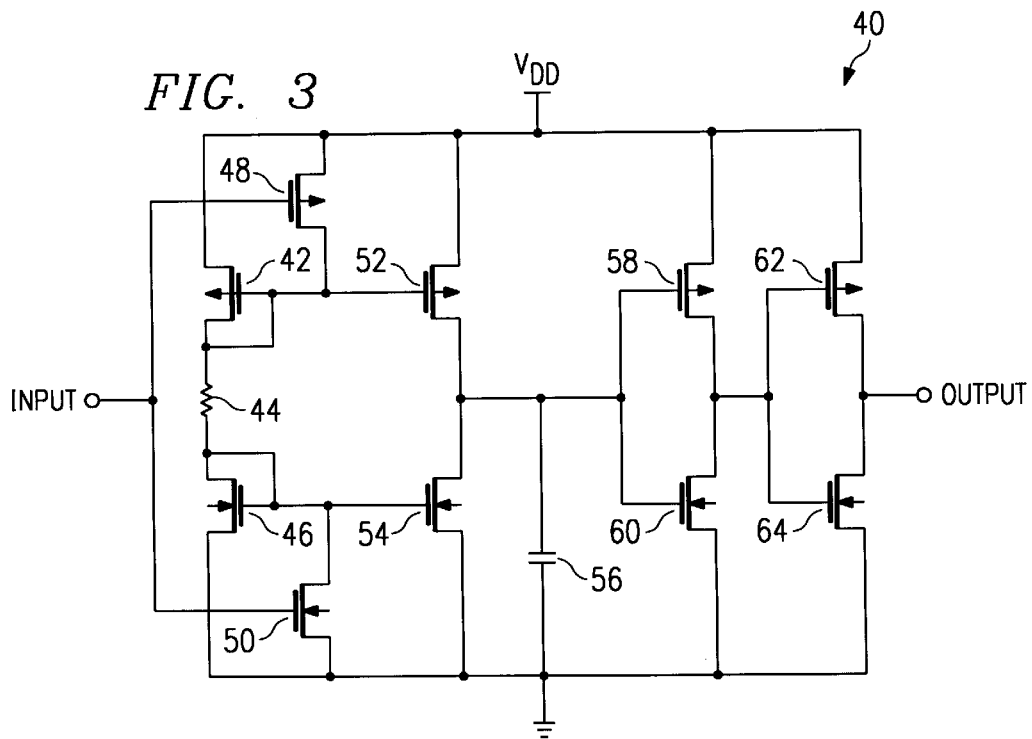
FIG. 3 is a schematic drawing of an embodiment of a delay circuit.

Referring now to FIG. 3, a delay circuit 40 constructed according to an embodiment of the invention will be described. The input of the delay circuit 40 is connected to the gate of P-channel transistor 48 and to the gate of a n-channel transistor 50. The source of transistor 48 is connected to a voltage source Vdd and the drain of transistor 48 is connected to the gate of p-channel transistor 52, to the gate and drain of p-channel transistor 42, and to the first end of resistor 44. The second end of resistor 44 is connected to the drain and gate of n-channel transistor 46, to the gate of n-channel transistor 54, and to the drain of n-channel transistor 50. The sources of transistors 46, 50, and 54 are connected to a voltage reference, ground. The source of transistor 52 is connected to Vdd. The drain of transistor 52 is connected to the drain of transistor 54, to the first plate of capacitor 56, to the gate of p-channel transistor 58, and to the gate of n-channel transistor 60. The second plate of capacitor 56 is connected to ground. The source of transistor 58 is connected to Vdd. The source of transistor 60 is connected to ground. The drain of transistor 58 and the drain of transistor 60 are connected to the gate of p-channel transistor 62 and to the gate of n-channel transistor 64. The source of transistor 62 is connected to Vdd. The source of transistor 64 is connected to ground. The drain of transistor 62 is connected to the drain of transistor 64, the connection thereof forms the output of the delay circuit 40. Although the construction of this circuit is described using MOSFET transistors, it is understood in the art that a similar circuit can be constructed using bipolar transistors, and the like.

In operation, an input signal is received at the gates of transistors 48 and 50. If the input signal is at a low voltage, transistor 48 turns on which allows for transistors 46 and 54 to conduct a constant current through transistor 54. The constant current through transistor 54 discharges capacitor 56. Conversely, capacitor 56 is charged when the input signal is at a high voltage since this high input voltage turns transistor 48 off and turns transistor 50 on. Therefore, transistors 46 and 54 are held off while transistors 42 and 52 are turned on. Thus, transistor 52 charges capacitor 56 with the constant current source formed by transistor 42, resistor 44, and transistor 52. The voltage on capacitor 56 buffered to the output by two inverters formed with transistors 58, 60, 62, and 64. In short, an input signal is received by transistors 48 and 50, delayed by the constant current sources or drains in combination with the capacitor, and then buffered by two inverters to the output of the delay circuit 40.

More specifically, transistors 42, 52 and 50 combine with resistor 44 to form a constant current source when the input to the delay circuit is at a high voltage. In this state, transistor 50 draws current through resistor 44 which turns on the current mirror formed by transistors 42 and 52. In the preferred embodiment, Vdd is about 5 volts and R44 is approximately 84 Kohms which defines the current through transistor 42 at about 40 microamps. Transistor 42 has an w/l (area) of 180/9 and transistor 52 has an w/l (area) of 9/9. Thus, the current through transistor 42 is approximately 20 times the current through transistor 52. Thus the current in transistor 52 is approximately 2 microamps. This constant current charges capacitor 56 when the input voltage is high. In general, the time delay can be approximately described as $$\text{time delay} = (\text{switch voltage}/V_{r44})\,(C56)\,(R44)\,(\text{current ratio})$$

where:
switch voltage=the switch voltage for the inverter
$V_{r44}$=the voltage drop across R44
C56=the capacitance of capacitor 56
R44=the resistance of resistor 44
current ratio=the current ratio of the applicable current mirror.

In an embodiment, a 10 picofarad capacitor, 84 kilo-ohm resistor, and current ratio of 20 are used which yields a delay of approximately (2.5 v/4 v) (10 pF) (84 k) (20)=10.5 microseconds. (Note that the voltage drop across resistor 44 is reduced from Vdd by the voltage drop across the transistors in the current path, which in this case totals to around 1 volts.)

Conversely, transistors 48, 46, and 54 combine with resistor 44 to form a constant current drain for discharging capacitor 56. When the input of delay circuit 40 is at a low voltage, transistor 50 is off and transistor 48 is on. This allows current to flow through transistor 48 and resistor 44, thus, turning on transistors 46 and 54. With an 84 kohm resistor and 5 volt Vdd, the current through transistor 46 is approximately equal to 40 microamps. Transistor 46 has 20 times the area as transistor 54 so that the current through transistor 54 is about 2 microamps. Therefore, capacitor 56 is discharged at the rate of 2 microamps which creates a delay of about 10.5 microseconds when the input of delay circuit is low.

Transistors 58 and 60 are configured to invert the voltage on the capacitor 56. When the voltage on the gates of transistors 58 and 60 are low, the voltage on output is low and vice versa. Transistors 62 and 64 are also configured as an inverter with the gates configured as the input and the drain of transistor 62 connected to the drain of transistor 64 to form the output of the inverter. The first and second inverter form the output stage of the delay circuit and buffer the voltage on the capacitor to the output of the delay circuit 40. It is understood that numerous circuits can be used for buffering voltages without departing from the spirit and scope of the invention.

The embodiment of the invention offers the advantage providing a delay which over 12 times longer than the delay created by a prior art circuit using the same resistor and capacitor value. Alternatively, this embodiment of the invention creates the equivalent delay, but uses a resistor and/or capacitor which is approximately 12 times smaller than is required by the prior art circuit to achieve the same time delay.

Figure 1:
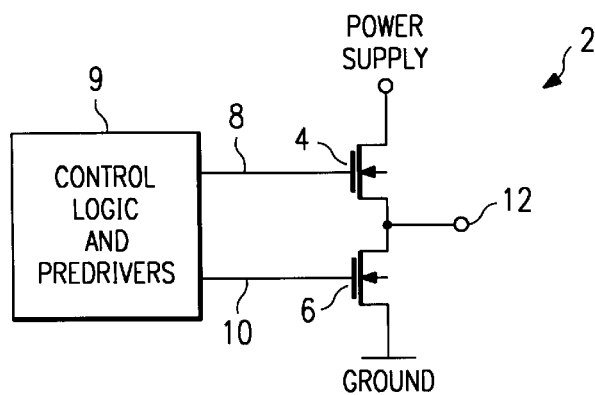
FIG. 1 is a schematic drawing of a prior art bridge configuration.
Figure 2:
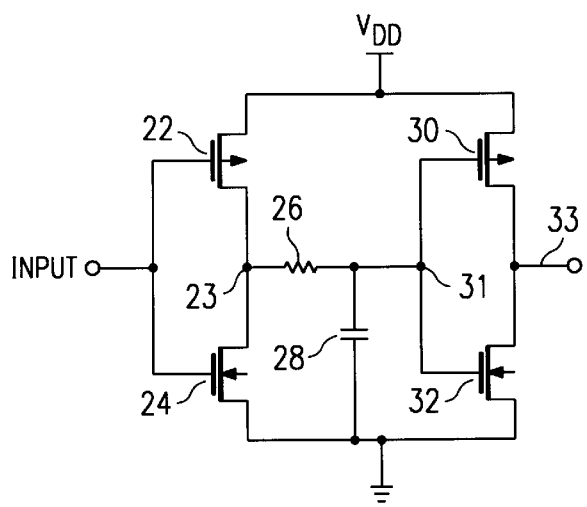
FIG. 2 is a schematic drawing of a prior art delay circuit.
Figure 4:
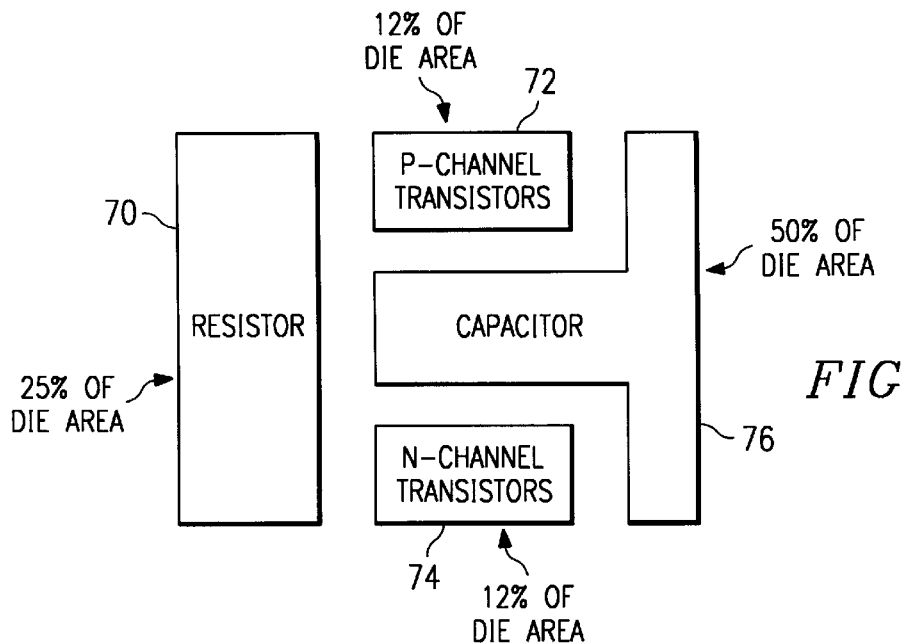
FIG. 4 is a plan view of a layout of an embodiment of the delay circuit on an integrated circuit.

FIG. 4 shows the layout of the embodiment and illustrates that 75% of the area required to implement the embodiment is used by the resistor and capacitor. The layout includes resistor 70, p-channel transistors 72, n-channel transistors 74, and capacitor 76. It can be noted that the layout is for five p-channel transistors, five n-channel transistors, one 84 kilo-ohm resistor, and one 10 picofarad capacitor and yields a 10.5 microsecond delay. The prior art delay circuit in FIG. 2 requires 4 transistors instead of 6 but only provides a delay of around 823 nanoseconds or would require a capacitor or resistor which over 12 times larger to yield the same delay. The layout in FIG. 4 shows that the extra transistors needed to implement the embodiment of the invention use much less area than the area needed to increase the resistance or capacitance by 12 times. Consequently this embodiment of the invention uses much less area than the prior art even though the invention requires 10 transistors (as compared to 4 transistors) because the transistors use much less area than capacitor or resistor which would be required. Therefore, the present invention provides relatively long delays without requiring large capacitors or resistors, without requiring a large area on an integrated circuit, and, thus, at a reduced cost relative to the prior art.

Figure 5:
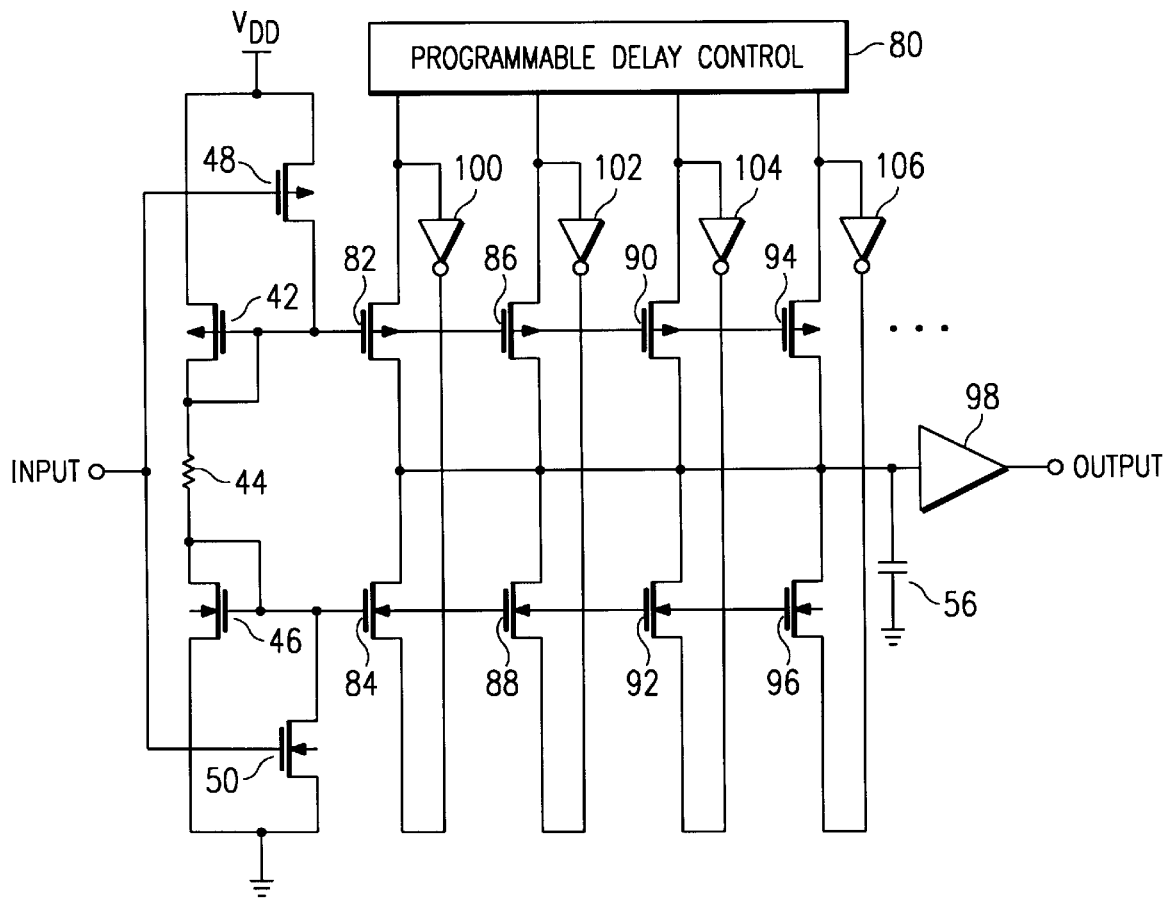
FIG. 5 is a schematic drawing of the delay circuit with a programmable delay control.

FIG. 5 discloses another embodiment which adds programmability to the delay circuit. This embodiment is constructed by having the source of p-channel MOSFET transistor 42 connected to Vdd and having its drain connected to a first end of resistor 44. The second end of resistor 44 is connected to the drain of n-channel MOSFET transistor 46. P-channel MOSFET transistor 48 has a source connected to Vdd and a drain connected to the gate of transistor 42. The drain of n-channel MOSFET transistor 50 is connected to the gate of transistor 46. The sources of transistors 46 and 50 are connected to ground. The gate of transistor 48 is connected to the gate of transistor 50, the connection of which forms the input for the circuit. The gate of transistor 42 is connected to the gates of p-channel MOSFET transistors 82, 86, 90, and 94. The gate of transistor 46 is connected to the gates of n-channel MOSFET transistors 84, 88, 92 and 96. The sources of transistors 82, 86, 90, and 94 are connected to programmable delay control circuit 80. The drains of transistors 82, 84, 86, 88, 90, 92, 94, and 96 are connected to each other and the first plate of capacitor 56. The input of inverter 100 is connected to the source of transistor 82 and the output of inverter 100 is connected to the source of transistor 84. Similarly, the inputs of inverters 102, 104, and 106 are connected to the sources of transistors 86, 90, and 94, respectively. Likewise, the outputs of inverters 102, 104, and 106 are connected to the sources of transistors 88, 92, and 96, respectively. The second plate of capacitor 56 is connected to ground. The output of buffer amplifier 98 is the output of the circuit. The programmable delay control circuit 80 can be constructed using many common digital circuits including input/output device, RAM memory, ROM memory, EPROM, EEPROM, and the like.

In operation, this embodiment operates in an analogous manner to the previous embodiment, but with the added feature that capacitor 56 can now be charged or discharged by one or more pairs of current mirrors. Transistors 48 and 50 are the input transistors; transistors 42 and 46 are the bias transistors; transistors 82, 86, 90, and 94 are the constant-current source transistors; and transistors 84, 88, 92, and 96 are the constant-current drains, for this embodiment.

More specifically, an input signal enters the circuit through the gate of transistor 48 which turns on transistor 42. Since the gate of transistor 42 is connected to the gates of transistors 82, 86, 90, and 94, transistor 42 provides the bias voltage for transistors 82, 86, 90, and 94 such that the current flow in the respective transistor is proportional (mirrored) to the current through transistor 42. However, transistors 82, 86, 90, and 94 will only be turned on if programmable delay control circuit 80 has enabled one of those transistors by providing the source of the respective transistor with a positive voltage. Therefore, the rate of delay or the rate of charging capacitor 56 is controlled by the programmable delay control circuit 80 and the relative ratios of transistors 42 to transistors 82, 86, 90, and 94. Inversely, when the input signal goes low, transistor 50 turns on bias transistor 46 which thereby provides the bias voltage to turn on transistors 84, 88, 92, and 96 to remove the charge from capacitor 56. Again, transistors 84, 88, 92, and 96 will not drain any current from capacitor 56 unless the transistors have been enabled by programmable delay control circuit 80 providing a sufficiently low voltage to the respective transistors drain. In this disclosure, it is assumed that the enable signals from the programmable delay control signal are digital in nature with sufficient current drive to drive the MOSFET transistors.

It will be clear to persons skilled in the art that additional transistor pairs can be added to the circuit to increase the range of programmability. Four transistor pairs are disclosed for illustrative purposes and could easily be modified to less pairs or more pairs by persons skilled in the art. Additionally, persons skilled in the art can vary the ratio of the current mirrors to further increase the range of programmability. By adjusting the current mirror ratios and/or increasing the number of transistor pairs persons skilled in the art can easily design a programmable delay which meets a given design criteria for versatility as well as flexibility.

Although the invention has been described and illustrated with a certain degree of particularity, it is understood that the present disclosure has been made only by way of example, and that numerous changes in the combination and arrangement of parts can be resorted to by those skilled in the art without departing from the spirit and scope of the invention, as hereinafter claimed.

We claim:

1. A delay circuit comprising:
   a plurality of current mirror current sources, with each current mirror current source having an enable input, having an input for receiving an input signal and having a constant current output for providing a constant current responsive to the input signal;
   a plurality of current mirror current drains, with each current mirror current drain having an enable input, having an input for receiving the input signal, and having a constant drain output for providing a constant current responsive to the input signal;
   a programmable delay control circuit having a plurality of enable signals, each signal connected to a current mirror current source and current mirror current drain such that the programmable delay control circuit selectively enables a pair of current mirror current source and drain;
   a fixed capacitor having a first plate and a second plate, the first plate of the capacitor connected to the constant current outputs of the plurality of current mirror current sources and to the constant drain outputs of the plurality of current drains, the second plate connected to a voltage reference, with each current mirror current source having a current path between a corresponding enable signal of said programmable delay control circuit and the first plate of said capacitor and with, each current mirror current drain having a current path between the corresponding enable signal of said programmable delay control circuit and the first plate of said capacitor; and
   an output stage having an input connected to the first plate of the capacitor and having an output for providing an output responsive to the voltage on the capacitor
   wherein a delay on the rising edge of the input signal is adjustable by the programmable delay control circuit selectively enabling the enable signal of one or more of the plurality of current mirror current sources to change an overall current source current provided by the plurality of current mirror current sources to the first plate of the capacitor, and
   wherein a delay on the falling edge of the input signal is adjustable by the programmable delay control circuit selectively enabling the enable signal of one or more of the plurality of current mirror current drains to change an overall current drain current provided by the plurality of current mirror current drains to the first plate of the capacitor.

2. The delay circuit of claim 1 wherein the programmable delay control circuit comprises a digital circuit.

3. The delay circuit of claim 2 wherein the digital circuit comprises programmable memory circuit.

4. The delay circuit of claim 3 wherein the programmable memory circuit comprises a programmable read only memory.

5. The delay circuit of claim 4 wherein the programmable read only memory comprises a EEPROM.

6. The delay circuit of claim 3 wherein the programmable memory circuit comprises a FLASH memory.

7. A delay circuit comprising:
   a first input transistor having a control element for receiving an input signal, and having a current path with a first end connected to a voltage source and a second end;
   a second input transistor having a control element for receiving the input signal, and having a current path with a first end and a second end connected to a voltage reference;
   a first bias transistor having a current path with a first end connected to the voltage source, having second end, and having a control element, wherein the second end is connected to the control element and to the second end of the current path of the first input transistor;
   a resistor having a first end connected to the second end of said first bias transistor and having a second end;

a second bias transistor having a current path from the second end of said resistor to the voltage reference, and having a control element connected to the second end of said resistor and to the first end of the current path of said second input transistor;

a capacitor having a first plate and having a second plate connected to the voltage reference;

an output stage having an input connected to the first plate of said capacitor and having an output;

a programmable delay control circuit having a plurality of enable outputs;

a plurality of constant-current sources, each constant current source of the plurality of constant-current sources having a current path between a corresponding enable output of said programmable delay control circuit and the first plate of said capacitor, and having a bias input connected to the control element of said first bias transistor such that the current flowing in the first bias transistor is proportionately mirrored in the current path of each constant-current source of the plurality of constant-current sources, responsive to the corresponding enable output and wherein a constant of proportionality may be chosen independently of the constant of proportionality of any other constant-current source; and a plurality of constant-current drains, each constant current drain of the plurality of constant-current drains having a current path between the corresponding enable output of said programmable delay control circuit and the first plate of said capacitor, and having a bias input connected to the control element of said second bias transistor such that the current flowing in the second bias transistor is proportionately mirrored in the current path of each constant-current drain of the plurality of constant-current drains, responsive to the corresponding enable output and wherein a constant of proportionality may be chosen independently of the constant of proportionality of any other constant-current drain.

8. The delay circuit of claim 7 wherein said programmable delay control circuit comprises a digital circuit.

9. The delay circuit of claim 8 wherein the digital circuit comprises programmable memory circuit.

10. The delay circuit of claim 9 wherein the programmable memory circuit comprises a programmable read only memory.

11. The delay circuit of claim 10 wherein the programmable read only memory comprises a EEPROM.

12. The delay circuit of claim 9 wherein the programmable memory circuit comprises a FLASH memory.

13. A delay circuit comprising:

a plurality of current mirror current elements, with each current mirror current element having an enable input, having an input for receiving an input signal and having a constant current output for providing a constant current responsive to the input signal;

a programmable delay control circuit having a plurality of enable signals, each enable signal connected to the plurality of current mirror current elements so as to selectively enable a current mirror current element of the plurality of current mirror current elements;

a fixed capacitor having a first plate and a second plate, the first plate of the capacitor connected to the constant current outputs of the plurality of current mirror current elements, the second plate connected to a voltage reference, with each current mirror current element having a current path between a corresponding enable signal of said programmable delay control circuit and the first plate of said capacitor; and an output stage having an input connected to the first plate of the capacitor and having an output for providing an output responsive to the voltage on the capacitor, wherein a delay on an active edge of the input signal is adjustable by the programmable delay control circuit selectively enabling the enable signal of one or more of the plurality of current mirror current elements to change an overall current provided by the plurality of current mirror current elements to the first plate of the capacitor.

14. The delay circuit of claim 13, wherein the active edge of the input signal is a rising edge of the input signal and the plurality of current mirror current elements are a plurality of current mirror current sources, and a delay on the rising edge of the input signal is adjustable by the programmable delay control circuit selectively enabling the enable signal of one or more of the plurality of current mirror current sources to change an overall current source current provided by the plurality of current mirror current sources to the first plate of the capacitor.

15. The delay circuit of claim 13, wherein the active edge of the input signal is a falling edge of the input signal and the plurality of current mirror current elements are a plurality of current mirror current drains, and a delay on the falling edge of the input signal is adjustable by the programmable delay control circuit selectively enabling the enable signal of one or more of the plurality of current mirror current drains to change an overall current drain current provided by the plurality of current mirror current drains to the first plate of the capacitor.

* * * * *